United States Patent
He et al.

(10) Patent No.: US 10,833,271 B2
(45) Date of Patent: Nov. 10, 2020

(54) METHOD FOR FABRICATION OF A CEM DEVICE

(71) Applicant: ARM Ltd., Cambridge (GB)

(72) Inventors: Ming He, San Jose, CA (US); Paul Raymond Besser, Sunnyvale, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/933,818

(22) Filed: Mar. 23, 2018

(65) Prior Publication Data

US 2019/0296236 A1 Sep. 26, 2019

(51) Int. Cl.
*H01L 49/00* (2006.01)
*H01L 21/62* (2006.01)

(52) U.S. Cl.
CPC ............ *H01L 49/003* (2013.01); *H01L 21/62* (2013.01)

(58) Field of Classification Search
CPC ... H01L 49/003; H01L 21/62; H01L 45/1666; H01L 45/1608; H01L 45/146; H01L 31/062
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,627,615 B1 | 4/2017 | Reid et al. | |
| 9,653,682 B1 | 5/2017 | Chou et al. | |
| 9,997,702 B2 | 6/2018 | Reid et al. | |
| 10,014,468 B2 * | 7/2018 | Paz de Araujo | ...... H01L 45/085 |
| 10,141,504 B2 * | 11/2018 | Shifren | ............... H01L 45/14 |
| 2006/0019485 A1 | 1/2006 | Komai et al. | |

(Continued)

FOREIGN PATENT DOCUMENTS

WO 2009114796 A1 9/2009
WO 2009140305 A1 11/2009

(Continued)

OTHER PUBLICATIONS

Application as Filed Mar. 23, 2018, U.S. Appl. No. 15/933,747, 75 pgs.

(Continued)

*Primary Examiner* — Hsien Ming Lee
(74) *Attorney, Agent, or Firm* — Berkeley Law & Technology Group, LLP

(57) ABSTRACT

Disclosed is a method for the fabrication of a correlated electron material (CEM) switching device, the method comprising: forming a layer of a conductive substrate; forming a layer of a correlated electron material on the conductive substrate; forming a layer of a conductive overlay on the layer of correlated electron material; and patterning the layers whereby to form a stack comprising a conductive substrate, a CEM layer and a conductive overlay, wherein the patterning comprises the following steps: forming a hard mask on the layer of the conductive overlay; dry etching the layer of conductive overlay and the layer of correlated electron material whereby to form a partially formed stack; depositing a coating of a protective polymer over at least sidewalls of the partially formed stack; and dry etching the layer of conductive substrate.

18 Claims, 8 Drawing Sheets

(56) References Cited

U.S. PATENT DOCUMENTS

| | | | |
|---|---|---|---|
| 2008/0106925 A1* | 5/2008 | Paz de Araujo | H01L 45/04 365/148 |
| 2009/0090899 A1 | 4/2009 | Lim et al. | |
| 2013/0112935 A1* | 5/2013 | Himeno | H01L 45/1253 257/4 |
| 2014/0097396 A1 | 4/2014 | Murase et al. | |
| 2014/0131654 A1 | 5/2014 | Tu et al. | |
| 2015/0243708 A1* | 8/2015 | Ravasio | H01L 27/2463 257/4 |
| 2016/0268505 A1* | 9/2016 | Sung | H01L 45/1233 |
| 2017/0213960 A1 | 7/2017 | Paz De Araujo et al. | |
| 2017/0237001 A1 | 8/2017 | Reid et al. | |
| 2017/0301859 A1 | 10/2017 | Paz De Araujo et al. | |
| 2017/0317143 A1 | 11/2017 | Chen et al. | |
| 2018/0013062 A1 | 1/2018 | Reid et al. | |
| 2018/0019394 A1 | 1/2018 | Reid et al. | |
| 2018/0053892 A1 | 2/2018 | Reid et al. | |
| 2018/0096713 A1 | 4/2018 | Chandra et al. | |
| 2018/0159028 A1 | 6/2018 | Shifren et al. | |
| 2018/0159029 A1 | 6/2018 | Paz De Araujo et al. | |
| 2018/0159031 A1 | 6/2018 | Paz De Araujo et al. | |
| 2018/0175290 A1 | 6/2018 | Reid et al. | |

FOREIGN PATENT DOCUMENTS

| | | | |
|---|---|---|---|
| WO | 2017160233 A1 | 9/2017 | |
| WO | WO 2017/160233 | * 9/2017 | H01L 45/04 |

OTHER PUBLICATIONS

Notice to File Corrected Application Papers, mailed Apr. 24, 2018, U.S. Appl. No. 15/933,747, 2 pgs.

Response to Notice to File Corrected Application Papers and Preliminary Amendment, filed Jun. 20, 2018, U.S. Appl. No. 15/933,747, 99 pgs.

Restriction Requirement, dated Mar. 27, 2019, U.S. Appl. No. 15/933,747, 7 pgs.

Replacement Sheets, filed Apr. 9, 2019, U.S. Appl. No. 15/933,747, 11 pgs.

Response to Restriction Requirement, filed May 28, 2019, U.S. Appl. No. 15/933,747, 10 pgs.

Application as Filed Mar. 23, 2018, U.S. Appl. No. 15/933,867, 68 pgs.

Notice to File Corrected Application Papers, mailed Apr. 20, 2018, U.S. Appl. No. 15/933,867, 2 pgs.

Response to Notice to Filed Corrected Application Papers and Preliminary Amendment, filed Jun. 20, 2018, U.S. Appl. No. 15/933,867, 101 pgs.

Restriction Requirement, dated Mar. 1, 2019, U.S. Appl. No. 15/933,867, 11 pgs.

Notification of Transmittal of the International Search Report and the Written Opinion of the International Searching Authority, or the Declaration, App. No. PCT/GB2019/050559, dated Jun. 11, 2019, 1 Page.

International Search Report, App. No. PCT/GB2019/050559, dated Jun. 11, 2019, 6 Pages.

Written Opinion of the International Searching Authority, App. No. PCT/GB2019/050559, 17 Pages.

Notification of Transmittal of the International Search Report and Written Opinion of the International Searching Authority, or the Declaration, App. No. PCT/GB2019/050562, dated Jun. 17, 2019, 1 Page.

International Search Report, App. No. PCT/GB2019/050562, dated Jun. 17, 2019, 6 Pages.

Written Opinion, App. No. PCT/GB2019/050562, dated Jun. 17, 2019, 13 Pages.

Notification of Transmittal of the International Search Report and the Written Opinion of the International Searching Authority, or the Declaration, App. No. PCT/GB2019/050479, Filed Feb. 21, 2019, dated Oct. 22, 2019, 1 Page.

International Search Report, App. No. PCT/GB2019/050479, Filed Feb. 21, 2019, dated Oct. 22, 2019, 6 Pages.

Written Opinion of the International Searching Authority, App. No. PCT/GB2019/050479, Filed Feb. 21, 2019, dated Oct. 22, 2019, 10 Pages.

Restriction Requirement, U.S. Appl. No. 16/271,377, dated Oct. 2, 2019, 8 Pages.

Response to Restriction Requirement, U.S. Appl. No. 16/271,377, Filed Nov. 27, 2019, 11 Pages.

Office Action, U.S. Appl. No. 16/271,377, dated Jan. 17, 2020, 25 Pages.

Response to Office Action, U.S. Appl. No. 16/271,377, Filed Apr. 17, 2020, 23 Pages.

Office Action, U.S. Appl. No, 15/933,747, dated Jun. 10, 2019, 12 Pages.

Response to Office Action, U.S. Appl. No. 15/933,747, Filed Sep. 5, 2019, 11 Pages.

Notice of Allowance, U.S. Appl. No. 15/933,747, dated Sep. 30, 2019, 15 Pages.

Issue Fee and Rule 312 Amendment, U.S. Appl. No. 15/933,747, Filed Dec. 27, 2019, 11 Pages.

Response to Rule 312 Amendment, U.S. Appl. No. 15/933,747, dated Jan. 17, 2020, 2 Pages.

Issue Notification, U.S. Appl. No. 15/933,747, Mailed Jan. 29, 2020, 1 Page.

Notification of Transmittal of the International Search Report and the Written Opinion of the International Searching Authority, or Declaration, App. No. PCT/GB2019/052948, dated Jan. 3, 2020, 1 Page.

International Search Report, App. No. PCT/GB2019/052948, dated Jan. 3, 2020, 5 Pages.

Written Opinion of the International Searching Authority, App. No. PCT/GB2019/052948, dated Jan. 3, 2020, 9 Pages.

Office Action, U.S. Appl. No. 16/163,190, dated Oct. 7, 2019, 17 Pages.

Response to Office Action, U.S. Appl. No. 16/163,190, Filed Jan. 6, 2020, 23 Pages.

Final Office Action, U.S. Appl. No. 16/163,190, dated Apr. 15, 2020, 19 Pages.

* cited by examiner

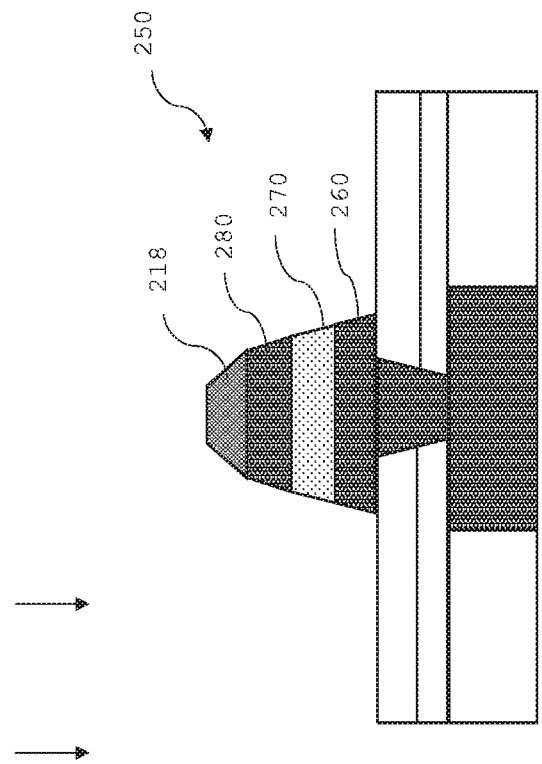
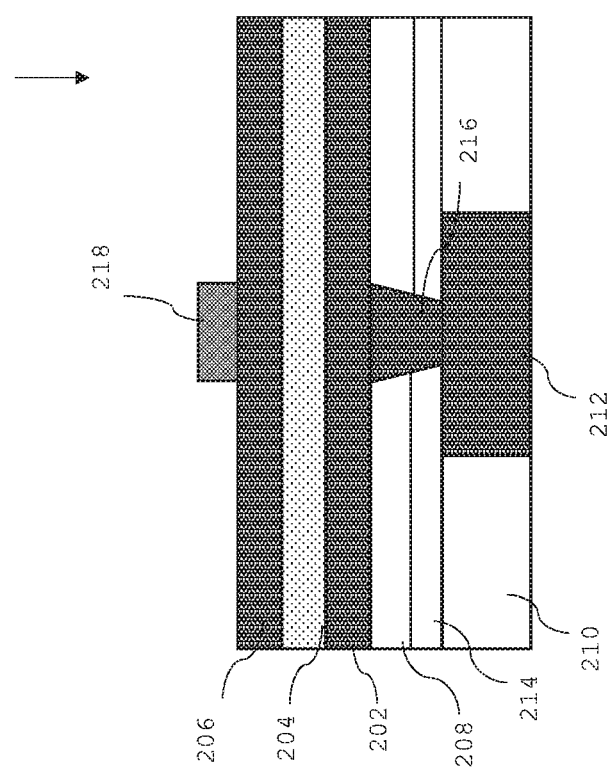

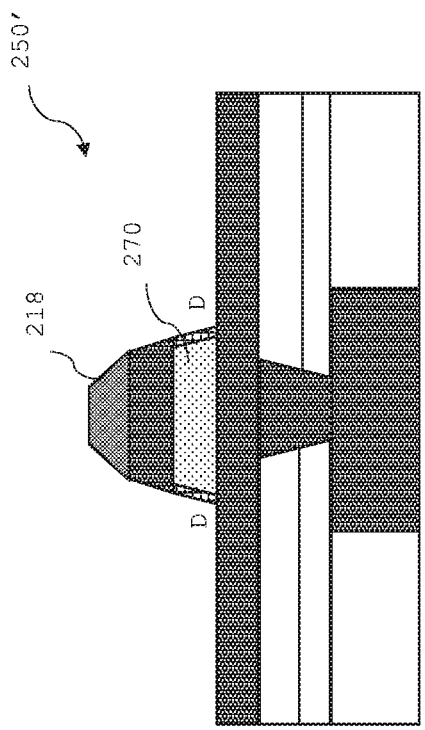
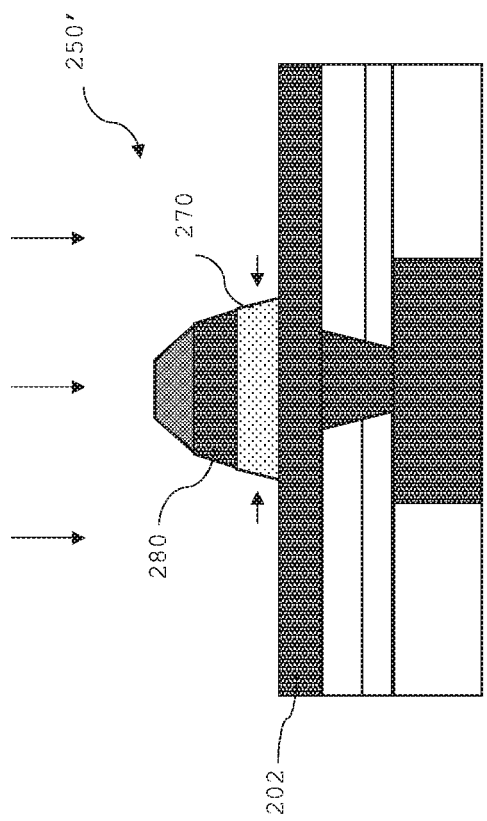
Fig. 3A
Fig. 3B

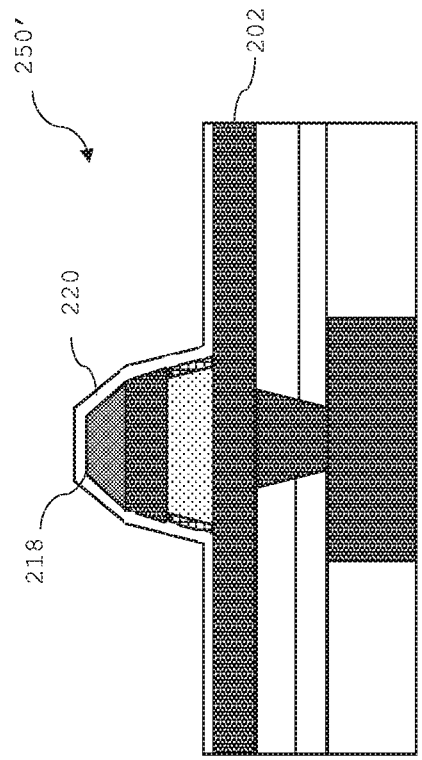
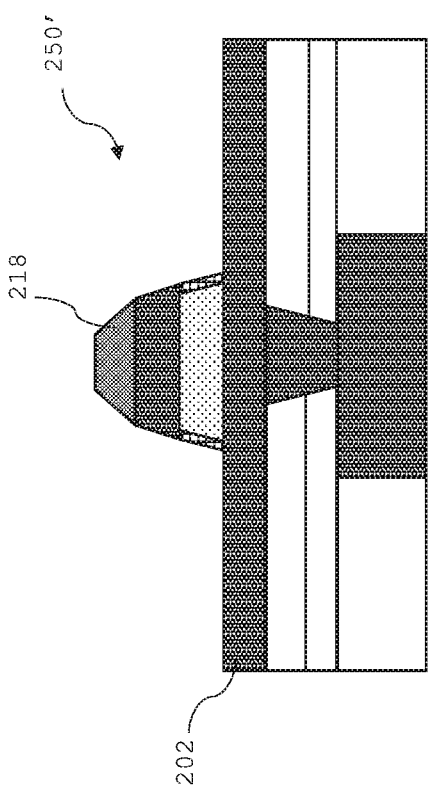
Fig. 5A
Fig. 5B

METHOD FOR FABRICATION OF A CEM DEVICE

The present disclosure is concerned with a method for the fabrication of a correlated electron material (CEM) device as well as with an integrated circuit including a CEM device obtained by the method.

Electronic switching devices are found in a wide variety of electronic device types, such as computers, digital cameras, cellular telephones, tablet devices, personal digital assistants and so forth, where they may function as memory and/or logic devices.

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

There appears to be an ever-increasing drive towards memory and/or logic devices which can exhibit lower power and/or higher speed. Switching devices comprising a correlated electron material are at the forefront of this drive not just because they can exhibit low power and/or high speed but also because they are generally reliable and easily and cheaply manufactured.

The present disclosure describes an improved CEM device and methods for its manufacture. The CEM device may, in particular, be a switching device. The CEM switching device may find application as a correlated electron random access memory (CERAM) in memory and/or logic devices which may be used with a wide range of electronic circuit types, such as memory controllers, memory arrays, filter circuits, data converters, optical instruments, phase locked loop circuits, microwave and millimeter wave transceivers, and so forth.

A CEM switching device can exhibit a rapid conductor-to-insulator transition as compared to other switching devices because the switching is brought about by an electron correlation rather than by a solid state structural phase change or by formation of filaments, as is found respectively in phase change memory devices and resistive RAM devices.

The rapid conductor-to-insulator transition of a CEM switching device may, in particular, be responsive to a quantum mechanical phenomenon in contrast to the melting/solidification or filament formation found respectively in phase change and resistive RAM devices. The quantum mechanical transition in a CEM switching device between a relatively conductive state and a relatively insulative state (or between a first impedance state and a second impedance state) may occur in several ways.

In one respect, a quantum mechanical transition of a CEM between a relatively insulative/higher impedance state and a relatively conductive/lower impedance state may be understood in terms of a Mott transition.

As used herein, references to a Mott transition are references to traditional Mott transitions (which are described in the literature as purely coulombic) as well as references to Mott-like transitions (in which the coulombic interaction is modified by some other electron interaction, such as a dipole-core charge interaction). Accordingly, a reference to a Mott insulator includes a reference to a charge-transfer (Mott) insulator, such as nickel (II) oxide, in which the columbic interaction or screening is modified by a charge transfer complex through hybridisation with the oxygen band.

In accordance with a Mott transition, a material may switch from a relatively insulative/higher impedance state to a relatively conductive/lower impedance state if a Mott transition condition is satisfied. The Mott criteria may be defined by $(n_c)^{1/3}a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state).

In another respect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In one arrangement, shown in FIG. 1B, a CEM switching device may comprise a layer of correlated electron material (a CEM layer) sandwiched between a conductive substrate and a conductive overlay. In this arrangement, the CEM switching device can act as memory storage element. In other arrangements, the CEM switching device may comprise either a CEM layer provided on a conductive substrate or a CEM layer provided with a conductive overlay. In these other arrangements, the device comprises source and drain regions providing for a flow of current across the device.

Referring now to FIG. 1A, a current density versus voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{read}$ (e.g., during a read operation) and detection of a current or current density at terminals of the CEM switching device (e.g., utilizing read window 102).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

The current in a CEM switching device may be controlled by an externally applied "compliance" condition, which may be determined at least partially on the basis of an applied external current, which may be limited during a write operation, for example, to place the CEM device into a relatively high-impedance state. This externally-applied compliance current may, in some devices, also set a condition of a current density for a subsequent reset operation to place the CEM device into a relatively high-impedance state. As shown in the particular device of FIG. 1A, a current density $J_{comp}$ applied during a write operation at point 116 to place the CEM switching device into a relatively low-impedance state, may determine a compliance condition for placing the CEM switching device into a high-impedance state in a subsequent write operation. As shown in FIG. 1A, the CEM device may be subsequently placed into a high-impedance state by application of a current density $J_{reset} \geq J_{comp}$ at a voltage $V_{reset}$ at point 108, at which $J_{comp}$ is externally applied.

The compliance may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

wherein $\lambda_{TF}$ corresponds to a Thomas Fermi screening length, and C is a constant.

A current or current density in region 104 of the voltage versus current density profile shown in FIG. 1A, may exist in response to injection of holes from a voltage signal applied across terminals of the CEM switching device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} = \frac{Q(V_{MI})}{t} \qquad (2)$$

$$Q(V_{MI}) = qn(V_{MI})$$

wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}}\right)^3$$

wherein $A_{CEM}$ is a cross-sectional area of a CEM switching device; and $J_{reset}(V_{MI})$ may represent a current density through the CEM switching device to be applied to the CEM switching device at a threshold voltage $V_{MI}$, which may place the CEM switching device into a relatively high-impedance state.

FIG. 1B shows a CEM switching device comprising a CEM layer sandwiched between a conductive substrate and a conductive overlay and FIG. 1C shows a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals. The equivalent circuit for a variable impedance device may comprise a variable resistor, such as variable resistor, in parallel with a variable capacitor. Of course, although a variable resistor and variable capacitor are depicted in FIG. 1C as comprising discrete components, the variable impedance device, such as that shown, may comprise a substantially homogenous CEM.

TABLE 1

Correlated Electron Switch Truth Table

| Resistance | Capacitance | Impedance |
|---|---|---|
| $R_{high}$ ($V_{applied}$) | $C_{high}$ ($V_{applied}$) | $Z_{high}$ ($V_{applied}$) |
| $R_{low}$ ($V_{applied}$) | $C_{low}$ ($V_{applied}$) ~0 | $Z_{low}$ ($V_{applied}$) |

Table 1 illustrates an example truth table for an example variable impedance device, such as the device of FIG. 1A. Table 1 shows that a resistance of a variable impedance device, such as that shown, may transition between a low-impedance state and a substantially dissimilar, high-impedance state as a function at least partially dependent on a voltage applied across the CEM switching device. The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM switching device.

The CEM switching device may be placed into a relatively low-impedance memory state, such as by transitioning from a relatively high impedance state, for example, via injection of a sufficient quantity of electrons to satisfy a Mott transition criterion. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $Ni_xO_y$ (wherein the subscripts "x" and "y" comprise whole numbers). As the term is used herein, "back-donation" refers to a supplying of one or more electrons (i.e. electron density) to a transition metal, transition metal oxide, or any combination thereof (i.e. to an atomic orbital of a metal), by an adjacent molecule of a lattice structure (i.e. a ligand), and at the same time donation of electron density from the metal center into an unoccupied antibonding orbital on the ligand/dopant. The electron back-donating ligand may be a π-back-bonding ligand such as carbonyl (CO), nitrosyl (NO), an isocyanide (RNC where R is H, $C_1$-$C_6$ alkyl or $C_6$-$C_{10}$-aryl), an alkene (e.g. ethene), an alkyne (e.g. ethyne) or a phosphine such as a trialkyl phosphine or a triaryl phosphine ($R_3P$ wherein R is H, $C_1$-$C_6$-alkyl or $C_6$-$C_{10}$-aryl), for example triphenylphosphine ($PPh_3$).

Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant, such as ammonia ($NH_3$), ethylene diamine ($C_2H_8N_2$), or members of an oxynitride family (NxOy), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:$NH_3$), thereby permitting the nickel oxide material to switch to exhibiting a substantially dissimilar impedance property, such as a high-impedance property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+ (e.g., $Ni^{2+}$ in a material, such as NiO:CO or NiO:$NH_3$). Conversely, electron back-donation may be reversed if a transition metal, such as nickel, for example, is placed into an oxidation state of 1+ or 3+.

Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \qquad (4)$$

Such disproportionation, in this instance, refers to formation of nickel ions as $Ni^{1+}+Ni^{3+}$ as shown in expression (4), which may bring about, for example, a relatively high-impedance state during operation of the CEM device. In an embodiment, a dopant such as a carbon-containing ligand, carbonyl (CO) or a nitrogen-containing ligand, such as an ammonia molecule ($NH_3$), may permit sharing of electrons during operation of a CEM device so as to give rise to the disproportionation reaction of expression (4), and its reversal, substantially in accordance with expression (5), below:

$$Ni^{1+}+Ni^{3+} \rightarrow 2Ni^{2+} \qquad (5)$$

As previously mentioned, reversal of the disproportionation reaction, as shown in expression (5), permits nickel-based CEM to return to a relatively low-impedance state.

In embodiments, depending on a molecular concentration of NiO:CO or NiO:NH$_3$, for example, which may vary from values approximately in the range of an atomic concentration of 0.1% to 10.0%, V$_{reset}$ and V$_{set}$, as shown in FIG. 1A, may vary approximately in the range of 0.1 V to 10.0 V subject to the condition that V$_{set}$≥V$_{reset}$. For example, in one possible embodiment, V$_{reset}$ may occur at a voltage approximately in the range of 0.1 V to 1.0 V, and V$_{set}$ may occur at a voltage approximately in the range of 1.0 V to 2.0 V, for example. It should be noted, however, that variations in V$_{set}$ and V$_{reset}$ may occur based, at least in part, on a variety of factors, such as atomic concentration of an electron back-donating material, such as NiO:CO or NiO:NH$_3$ and other materials present in the CEM device, as well as other process variations, and claimed subject matter is not limited in this respect.

The fabrication of a CEM device into an integrated circuit generally begins with the formation of the device layers by patterning a layer of a conductive substrate, a layer of a correlated electron material and a layer of a conductive overlay which have been deposited on an insulating substrate, such as silica, having one or more embedded interconnects.

The patterning forms a stack from the deposited layers which may be fabricated to full integration in an integrated circuit by depositing a cover layer comprising an insulating material, such as silica, over the stack, patterning the cover layer whereby to form a trench in which the conductive overlay is exposed and depositing a metal interconnect in the trench which contacts the conductive overlay.

Note that the patterning of the cover layer may also comprise forming an additional trench and via for an additional metal interconnect enabling contact between other devices, such as transistors, at different levels in a 3-dimensional integrated circuit.

The materials of the conductive substrate, the CEM layer and the conductive overlay tend to be chemically resistant so that a dry etching (rather than a wet etching) is required in order to form the stack.

As used herein the expression "dry etching" refers to the removal of a material by exposing a surface of the material to a bombardment of ions (usually derived from a plasma of reactive gases such as fluorocarbons, oxygen, chlorine, boron trichloride, sometimes with addition of nitrogen, argon, helium, and other gases) to remove portions of the material from the exposed surface.

Note that dry etching is a directional (or anisotropic) process which is typically used to remove material in the vertical direction (rather than the horizontal direction).

One problem with the fabrication of a CEM device to an integrated circuit is that dry etching of the layer of correlated electron material can lead to damage at the sidewalls of the CEM layer in the stack.

This damage appears to disrupt the crystal structure or doping of the CEM layer at the sidewall and lead to a metal overlay or partially bound moieties which may adsorb moisture. In either case, the result is a conductive path (a so-called "leaky channel") between the conductive overlay and the conductive substrate at each sidewall which can disrupt the switching of the CEM layer and degrade its performance.

Another problem with the fabrication of a CEM device to an integrated circuit is that the dry etching of the layer of conductive substrate can lead to sputtering of the material of the conductive substrate onto the sidewalls of the CEM layer in the stack.

This sputtering results in a conductive path between the conductive overlay and the conductive substrate at each sidewall of the CEM layer which can disrupt the switching of the CEM layer and degrade its performance.

The present disclosure relates to a method which avoids these problems and the formation of unwanted conductive paths between the conductive overlay and the conductive substrate at the sidewalls of the CEM layer.

Accordingly, the present disclosure provides a method for the integration of a correlated electron material (CEM) device to an integrated circuit, the method comprising
  forming a layer of a conductive substrate on a glass or other substrate;
  forming a layer of a correlated electron material on the layer of conductive substrate;
  forming a layer of a conductive overlay on the layer of correlated electron material; and
  patterning the layers whereby to form a stack comprising a conductive substrate, a CEM layer and a conductive overlay, wherein the patterning comprises the following steps:
  forming a hard mask on the layer of conductive overlay;
  dry etching the layer of conductive overlay and the layer of correlated electron material whereby to form a partially formed stack;
  depositing a coating of a protective polymer over at least sidewalls of the partially formed stack; and
  dry etching the layer of conductive substrate.

The hard mask may comprise a dielectric material such as silica (SiO$_2$) or silicon nitride (Si$_3$N$_4$) which is generally resistant to the dry etching used for forming the stack but susceptible to wet or other etching.

It may be formed, for example, by standard lithographic processes using a photoresist spun or otherwise deposited onto a silica or silicon nitride layer formed on the layer of conductive overlay. Alternatively, the photoresist may be spun or otherwise deposited on a stack comprising a planarization layer and an antireflection layer deposited on the silica or silicon nitride layer.

In embodiments, the method comprises depositing a coating of a protective polymer over the whole of the partially formed stack viz., the protective polymer coats not just the sidewalls of the partially formed stack but also the upper surfaces of the layer of conductive substrate and the hard mask.

The method may further comprise dry etching the protective polymer coating whereby to remove the protective polymer from the upper surfaces of the layer of conductive substrate and the hard mask.

This dry etching of the protective polymer coating may comprise a separate step to the etching of the conductive substrate. It may use different process conditions or the same process conditions as compared to those used for the dry etching of the layer of conductive substrate.

The protective polymer may comprise any organic polymer which is susceptible to dry etching (for example, reactive ion etching) and to wet etching. It may, in particular, comprise a fluorocarbon, or hydrofluorocarbon polymer, for example, tetrafluoro-ethylene.

The coating of the protective polymer may be formed by physical vapour deposition or by chemical vapour deposition. In one embodiment, the coating of protective polymer is formed by chemical vapour deposition of a fluorocarbon or hydrofluorocarbon polymer using gases of formula $C_xH_yF_z$ where x and z>0 and y≥0.

The method may further comprise removing the coating of protective polymer from the side-walls of the stack after the dry etching of the layer of conductive substrate. The removal may be carried out by wet cleaning the stack by, for example, dipping in a solution of dilute hydrofluoric acid (DHF).

Although the wet clean will generally be selective for the protective polymer coating it may also etch the correlated electron material. Advantageously, therefore, the method may further comprise etching a portion of the correlated electron material at the sidewalls of the CEM layer whereby to remove any damage which has occurred during the dry etching of the layer of correlated electron material.

The removal of portions of the correlated electron material at the sidewalls of the CEM layer in the stack may provide an indent or recess in the CEM layer which extends into the CEM layer to an extent from about 1 nm to about 10 nm. The indent or recess may also extend around the CEM layer and across the whole of the thickness of the CEM layer.

Of course, the method may further comprise removing the hard mask from the stack. The removal may be carried out prior to forming the cover layer of insulating material or at the same time as the etching of a trench in the cover layer.

The method may also comprise depositing a cover layer comprising an insulating material, such as silica, over the stack and patterning the cover layer whereby to form a trench in the cover layer in which (at least a part) of the conductive overlay protrudes.

The method may further comprise depositing a metal barrier layer over the conductive overlay and at least the interior walls of the trench. The metal barrier layer prevents the migration of metal ion from the metal interconnect into the cover plate and the device. It also protects against the ingress of moisture from ambient or the cover layer to the stack. The metal barrier layer may, in particular, comprise one or more of tantalum nitride (TaN), titanium nitride (TiN), cobalt (Co), ruthenium (Ru) and tantalum (Ta).

The method may further comprise depositing a moisture barrier layer over the stack prior to the deposition of the cover layer. The moisture barrier layer, which may, for example, comprise silicon nitride ($Si_3N_4$), silicon carbon nitride (SiCN) or silicon carbide, prevents the ingress of moisture, for example, from ambient or from the etching of the cover layer, into the sidewalls of the fabricated device.

Note that the moisture barrier layer is etched away from the upper surface (and a part of the sidewalls) of the conductive overlay when the trench is etched in the cover layer.

The method may further comprise depositing a metal interconnect whereby to substantially fill the trench. The metal interconnect may comprise aluminium, cobalt, ruthenium, tungsten or copper.

The forming of the layer of conductive overlay, the layer of correlated electron material and the layer of conductive substrate may comprise any suitable physical vapour deposition or chemical vapour deposition. In embodiments, the forming of at least the CEM layer comprises a chemical vapour deposition and, in particular, an atomic layer deposition.

In embodiments, the conductive overlay and/or the conductive substrate comprise a major (bulk) layer comprising a conductive metal nitride and a minor layer comprising a noble metal or a conductive metal oxide.

Accordingly, the forming of the layer of conductive substrate comprises depositing a first layer of a metal nitride and depositing a second layer of a noble metal or other conductive material on the first layer. And the forming of the conductive overlay may comprise depositing a first layer of a noble metal or other conductive material and depositing a second layer of a metal nitride on the first layer.

The metal nitride may comprise one or more of titanium nitride, tantalum nitride, and tungsten nitride. The noble metal or other conductive material may comprise platinum, titanium, copper, aluminium, cobalt, nickel, tungsten, cobalt silicide, ruthenium oxide, chromium, gold, palladium, indium tin oxide, tantalum, silver, iridium, iridium oxide or any combination thereof.

The forming of the layer of conductive substrate may be on an insulating substrate, such as a silica, provided on an underlying dielectric material. The substrate may include a via for contacting the conductive substrate with a copper, tungsten, ruthenium, cobalt or aluminium interconnect provided in the dielectric material.

In one embodiment, the substrate comprises a fluorosilicate glass (FSG) plate provided on a (low k) dielectric material. The substrate includes a via for contacting the conductive substrate of the device through the glass (FSG) plate with a copper interconnect embedded in the dielectric material.

In embodiments, the method may comprise forming a layer of a correlated electron material comprising a doped metal compound of a d- or f-block element (especially one exhibiting an incomplete d- or f-block shell) such as nickel, cobalt, iron, yttrium or ytterbium. It may comprise forming a CEM layer comprising an oxide of a d- or f-block element and, in particular, a transition metal oxide (TMO) such as nickel oxide, cobalt oxide, hafnium oxide, iron oxide or an oxide or a rare earth element such as yttrium oxide.

The method may alternatively comprise forming a layer of a correlated electron material comprising a complex (or "mixed") oxide of d- and/or f-block elements, for example, as a perovskite such as chromium doped strontium titanate, lanthanum titanate, praseodymium calcium manganate or praseodymium lanthanum manganate or a complex oxide or a rare earth element and a transition metal such as yttrium titanium oxide or ytterbium titanium oxide.

In embodiments, the metal compound of the correlated electron material may be of general formula AB:$L_x$ (for example, NiO:CO) wherein the AB denotes, for example, a transition metal compound, such as a transition metal oxide, $L_x$ denotes an extrinsic ligand for the metal and x indicates the number of units of ligand for one unit of the transition metal or transition metal compound. The value of x for any specific ligand and any specific combination of ligand with a transition metal oxide may be determined simply by balancing valences.

In embodiments, the method may form a CEM layer comprising doped nickel oxide, such as NiO:$L_x$, wherein the dopant comprising a back-donating ligand comprises a molecule of the form $C_aH_bN_dO_f$ (in which a≥1, and b, d and f≥0) such as: carbonyl (CO), cyano ($CN^-$), ethylenediamine ($C_2H_8N_2$), 1, 10-phenanthroline ($C_{12}H_8N_2$), bipyridine ($C_{10}H_8N_2$), pyridine ($C_5H_5N$), acetonitrile ($CH_3CN$) and cyanosulfanides such as thiocyanate ($NCS^-$).

The forming of the layer of correlated electron material may, in particular, use a physical vapour deposition, such as reactive sputtering, of a transition metal compound, for example, a transition metal oxide, in an atmosphere of a gaseous oxide, such as carbon monoxide (CO).

The forming of the layer of correlated electron material may, in particular, comprise a chemical vapour deposition, such as an atomic layer deposition (ALD), of a transition metal compound, for example, a transition metal oxide.

The atomic layer deposition may form the layer of correlated electron material utilising separate precursor molecules AX and BY, according to the expression (6) below:

$$AX_{(gas)} + BY_{(gas)} = AB_{(solid)} + XY_{(gas)} \qquad (6)$$

wherein "A" of expression (4) corresponds to the transition metal, and "AB" a transition metal compound, such as a transition metal oxide.

The "X" of expression (4) may comprise one or more of an organic or other ligand, such as amidinate (AMD), cyclopentadienyl (Cp), bis(ethylcylcopentadienyl) ((EtCp)$_2$), bis(pentamethylcyclo-pentadienyl) (C$_5$(CH$_3$)$_5$)$_2$bis(2,2,6,6-tetramethylheptane-3,5-dionato) ((thd)$_2$), acetylacetonato (acac), bis(methylcyclopentadienyl) ((MeCp)$_2$), dimethylglyoximato (dmg)$_2$, (apo)$_2$ where apo is 2-amino-pent-2-ene-4-onato, (dmamb)$_2$ where dmamb is 1-dimethylamino-2-methyl-2-butanolato, (dmamp)$_2$ where dmamp is 1-dimethylamino-2-methyl-2-propanolato.

Suitable precursor molecules AX include organometallic compounds of the transition metals having one or more of these ligands alone or in combination together with other ligands.

Accordingly, in some embodiments, a nickel based precursor AX (NiX) may comprise, for example, nickel amidinate (Ni(AMD)), bis(cyclopentadienyl)nickel (Ni(Cp)$_2$), nickel acetoacetonate (Ni(acac)$_2$), nickel dimethylglyoximate (Ni(dmg)$_2$), bis(ethylcyclo-pentadienyl) nickel (Ni (EtCp)$_2$), bis(methylcyclopentadienyl)nickel (Ni(CH$_3$C$_5$H$_4$)$_2$), bis(pentamethylcyclopentadienyl)nickel (Ni(C$_5$(CH$_3$)$_5$)$_2$), nickel 2-amino-pent-2-en-4-anato (Ni(apo)$_2$), Ni(dmamb)$_2$ where dmamb is 1-dimethylamino-2-methyl-2-butanolato, Ni(dmamp)$_2$ where dmamp is 1-dimethyl-amino-2-methyl-2-propanolato.

The precursor "BY" in expression (4) may comprise a gaseous oxide (as an oxidant), such as water (H$_2$O), oxygen (O$_2$), ozone (O$_3$), nitric oxide (NO), nitrous oxide (N$_2$O) hydrogen peroxide (H$_2$O$_2$) or plasma-formed oxygen radical (O.).

The present disclosure also provides a correlated electron material (CEM) device, comprising a conductive substrate, a CEM layer and a conductive overlay, wherein the CEM layer has sidewalls having, at least in part, a recess as compared to the sidewalls of the conductive substrate and the conductive overlay.

The present disclosure further provides an integrated circuit comprising a CEM device comprising a conductive substrate, a CEM layer and a conductive overlay, wherein the device is provided between an upper metal interconnect in a cover layer and a lower metal interconnect in a substrate, the upper metal interconnect and the conductive overlay having a trench contact, and wherein the CEM layer has sidewalls having, at least in part, a recess therein (as compared to the sidewalls of the conductive substrate and the conductive overlay).

The present disclosure also provides an electronic device comprising an integrated circuit having a CEM device comprising a conductive substrate, a CEM layer and a conductive overlay, wherein the device is provided between an upper metal interconnect in a cover layer and a lower metal interconnect in a substrate, the upper metal interconnect and the conductive overlay having a trench contact, and wherein the CEM layer has sidewalls having, at least in part, a recess therein (as compared to the sidewalls of the conductive substrate and the conductive overlay).

Embodiments in the CEM device, integrated circuit and electronic device will be apparent from the description of embodiments of the method of the present disclosure.

Note, in particular, that the CEM layer may be interposed between the conductive substrate and the conductive overlay. The recess may extend inwardly to an extent from about 1 nm to about 10 nm. It may extend around the CEM layer and span substantially the whole of the thickness of the CEM layer. A moisture barrier layer may be provided on substantially the whole of the sidewalls of the conductive substrate and the sidewalls of the CEM layer (including the inner walls of the recess) as well as on the sidewalls of the conductive overlay below and up to the trench contact.

The methods, CEM device and integrated circuit according to the present disclosure will now be described in more detail having regard to the following non-limiting embodiments and the accompanying drawings in which:

FIGS. 2A and 2B are schematic diagrams showing the dry etching of a layer of conductive substrate, a layer of correlated electron material and a layer of conductive overlay to form a stack for a CEM switching device;

FIGS. 3A and 3B are schematic diagrams showing the damage which can occur at the sidewalls of the CEM layer during dry etching to form a stack for a CEM switching device;

FIGS. 5A, 5B, 5C, 5D, 5E and 5F are schematic diagrams showing one embodiment of the method of the present disclosure.

Figure 1A:
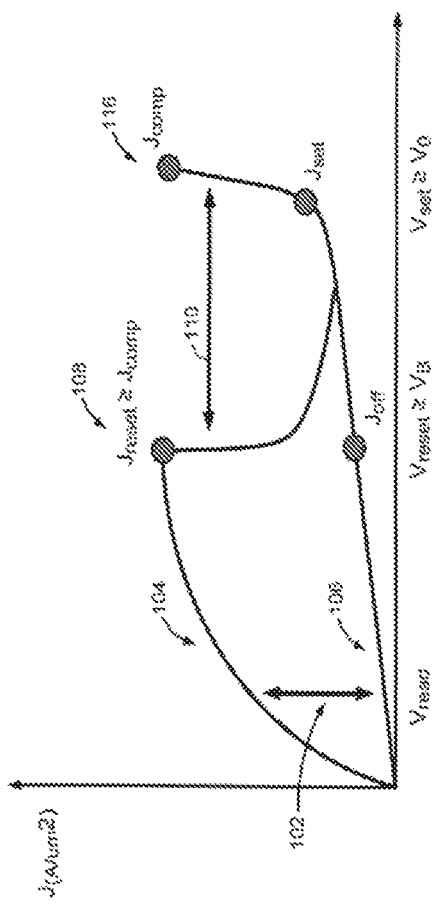
FIG. 1A shows a schematic illustration of a current density versus voltage profile of a CEM switching device.
Figure 1C:
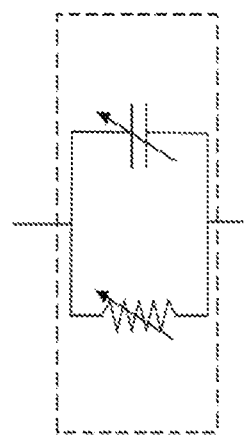
FIG. 1C shows a schematic diagram of an equivalent circuit for the switching device.
Figure 1B:
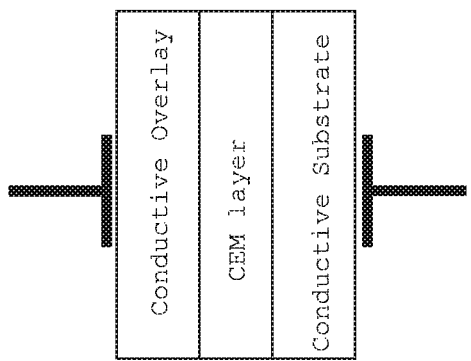
FIG. 1B shows a schematic illustration of the CEM switching device of FIG. 1A.

Referring now to FIGS. 2A and 2B, there is shown a scheme generally illustrating the dry etching of a layer of a conductive substrate 202, a layer of a correlated electron material 204 and a layer of a conductive overlay 206 to from a stack, generally designated 250, comprising a conductive overlay 280, a CEM layer 270 and a conductive substrate 260 for a CEM switching device.

The CEM layer 270 may comprise a doped nickel oxide NiO:C as described above. The conductive substrate 260 and the conductive layer 280 may each comprise a first (bulk) layer comprising tantalum nitride (TaN) and a second layer (liner) comprising iridium (not shown). The iridium layer in both the conductive overlay 280 and the conductive substrate 260 contacts the CEM layer 270.

Referring now to FIG. 2A, these layers are provided on a (FSG) glass (SiO$_2$) plate 208 which is in turn disposed on a substrate 210 in which a copper interconnect 212 is provided. The substrate 210 may comprise (FSG) glass (SiO$_2$) or low k SiCOH dielectric. A silicon nitride barrier layer 214 is provided between the substrate 210 and the glass plate 208. The glass plate 208 and the barrier layer 214 include a via 216 providing contact between the conductive substrate 202 and the copper interconnect 212.

A hard mask 218 comprising a layer of a silica or silicon nitride is provided on the conductive overlay 202. The hard mask 218, which may be patterned by a standard photolithographic process using a positive or negative photoresist and dry etch, defines the lateral dimensions of the (trapezoidal) CEM switching device.

Referring now to FIG. 2B, the dry etching (for example, reactive ion etching or deep reactive ion etching) results in a stack 250 which is ready for integration of the device to an integrated circuit.

The integration may, for example, comprise a deposition of a cover layer comprising an insulating material, for example, silica, etching of a trench in the cover layer which exposes the conductive overlay of the device and deposition of an interconnect in the trench so that it contacts the conductive overlay of the device and fills the trench.

The integration may also comprise deposition of a moisture barrier layer (not shown), for example, of silicon nitride ($Si_3N_4$), over the stack 250 prior to the etching of the trench. The moisture barrier layer, which is etched back with the hard mask during the etching of the trench, encapsulates and seals the sidewalls of stack against the ingress of moisture into the device (not shown).

It may further comprise deposition of a metal barrier layer, for example, titanium nitride or tantalum nitride, in the trench and over the conductive overlay prior to deposition of the metal interconnect. This metal barrier layer prevents migration of metal into the device (and also acts to seal the stack against the ingress of the moisture to the device).

FIGS. 3A and 3B show a scheme generally illustrating the occurrence of damage D at the sidewalls of the CEM layer 270 during dry etching of layer of correlated electron material 204.

Referring now to FIG. 3A, the dry etching of the CEM layer 204, whilst removing the correlated electron material in the vertical direction, has a component which damages, but does not remove, the correlated electron material in the horizontal direction.

Referring now to FIG. 3B, this damage may disrupt the crystal structure or doping of the CEM layer 270 at the sidewall leading to partially bound moieties which can adsorb moisture and/or cause the metallisation of the CEM layer. In either case, the damage may provide a conductive path (hashed lines; a so-called "leaky channel") between the conductive overlay 280 and the conductive substrate 260 disrupting the switching of the CEM layer 270 and degrading its performance.

Figure 4A:
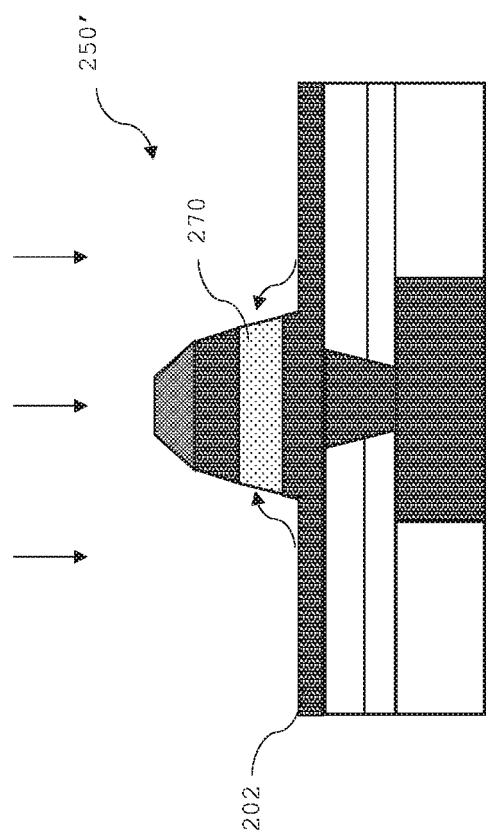
FIGS. 4A and 4B are schematic diagrams showing the sputtering of the conductive substrate onto the sidewalls of the CEM layer which can occur during dry etching to form a stack for a CEM switching device.
Figure 4B:
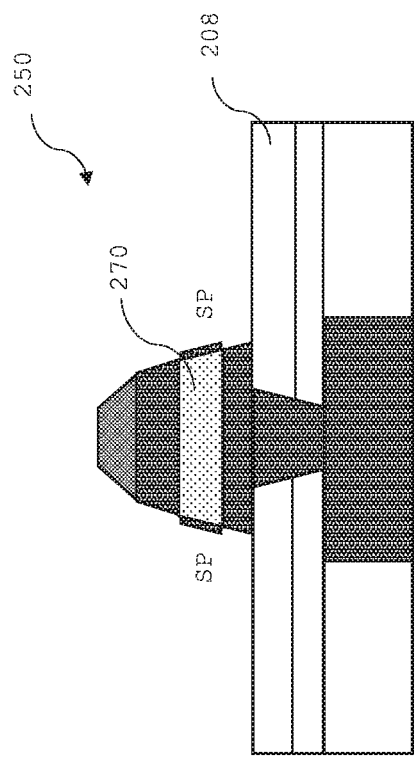

FIGS. 4A and 4B show a scheme generally illustrating the occurrence of sputtering (of iridium at least) SP onto the sidewalls of the CEM layer 270 during dry etching of the layer of conductive substrate 202. Note that, although it is not shown here, the CEM layer 270 may be a CEM layer 270 which has suffered damage D at its sidewalls as described above.

Referring now to FIG. 4A, although the dry etching of the layer of conductive substrate 202 leads to removal from the glass plate 208, a substantial portion (of iridium at least) is trapped at the sidewalls of the part-formed stack 250' and, in particular, at the sidewalls of the CEM layer 270.

Referring now to FIG. 4B, the material (iridium at least) trapped at the sidewalls of the CEM layer 270 may result in a conductive path in the stack 250 at the sidewall of the CEM layer 270 between the conductive overlay 280 and the conductive substrate 260 which can also disrupt the switching of the device and degrade its performance.

Referring now to FIGS. 5A, 5B, 5C, 5D, 5E and 5F, one embodiment of the method of the present disclosure provides that the dry etching is stopped after the layer of correlated electron material 204 has been removed and that a protective polymer coating 220 is provided over the part-formed stack 250' (and the layer of conductive substrate 202).

Referring now to FIG. 5A, the interruption of the dry etching leaves a layer of conductive substrate 202 which is substantially intact as compared to the conductive overlay 280 and the CEM layer 270. Note that the CEM layer 270 is shown here as a CEM layer which has suffered damage D at the sidewalls as described above.

During the dry etching, the etch trace data produced by the etch chamber (not shown) may be monitored so that the dry etching can be stopped when the data shows attenuation of a nickel-based signal. The attenuation of the nickel-based signal indicates that the layer of correlated electron material 204 is etched through and that the layer of conductive substrate 202 has become exposed.

Referring now to FIG. 5B, after the dry etching has been stopped, the whole of the part-formed stack 250' is coated with a protective polymer. The coating of protective polymer 220 may be provided by a polymer deposition process which occurs within the etch chamber (i.e. an in-situ process). Note that the coating of protective polymer 220 covers not just the sidewalls of the part-formed stack 250' but also the upper surfaces of the hard mask 218 and the layer of conductive substrate 202.

Figure 5C:
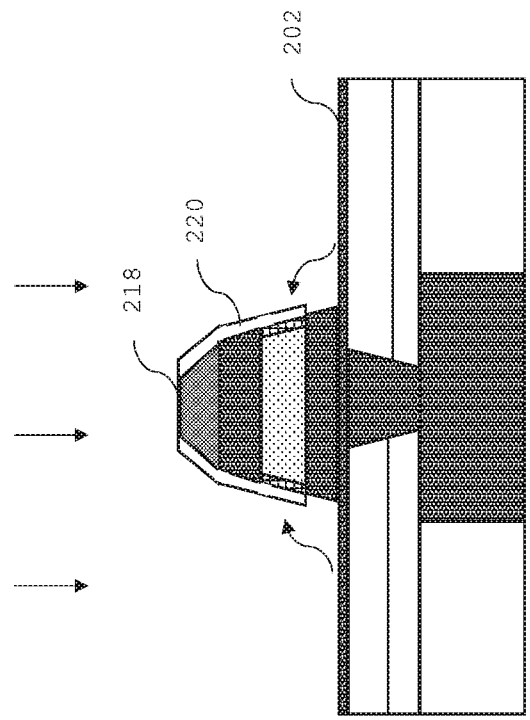
Figure 5D:
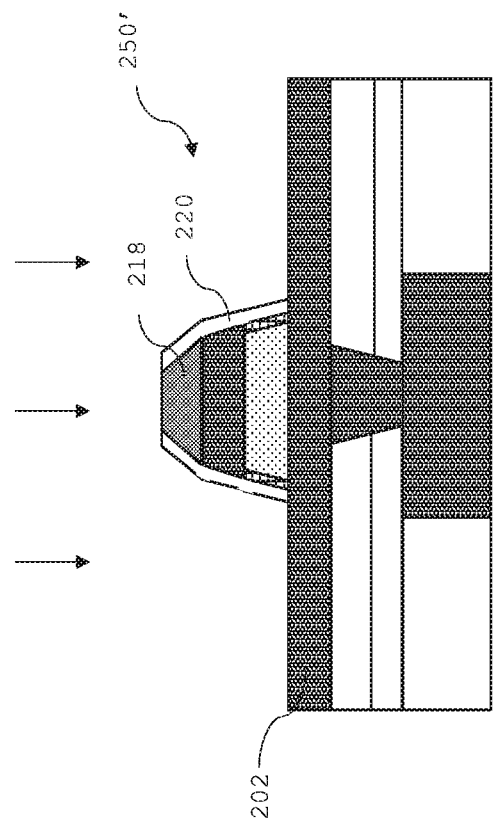

Referring now to FIG. 5C, the dry etching is resumed following the polymer deposition such that it removes the coating of protective polymer 220 from the upper surfaces of the hard mask 218 and the layer of conductive substrate 202 but not from the sidewalls of the part-formed stack 250'.

Note that the dry etching may employ the same process conditions or different process conditions as compared to those used for dry etching the layer of conductive substrate 202 (or the layer of correlated electron material 204 or the layer of conductive overlay 206).

Figure 5E:
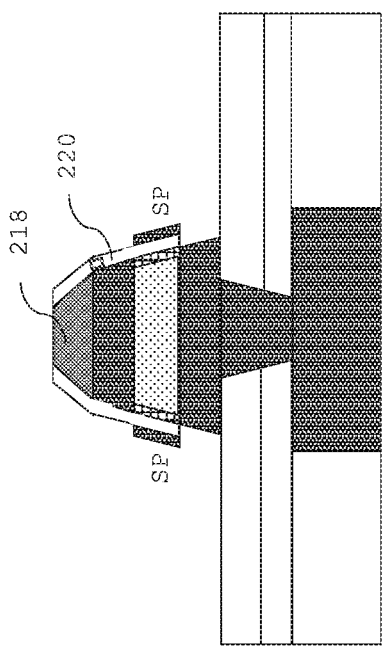

Referring now to FIG. 5E, the dry etching of the layer of conductive substrate leads to its removal from the glass plate 208 but the trapping of the material from the layer of conductive substrate 202 (for example, iridium at least) at the sidewalls of the stack 250 occurs on the protective polymer coating 220.

Figure 5F:
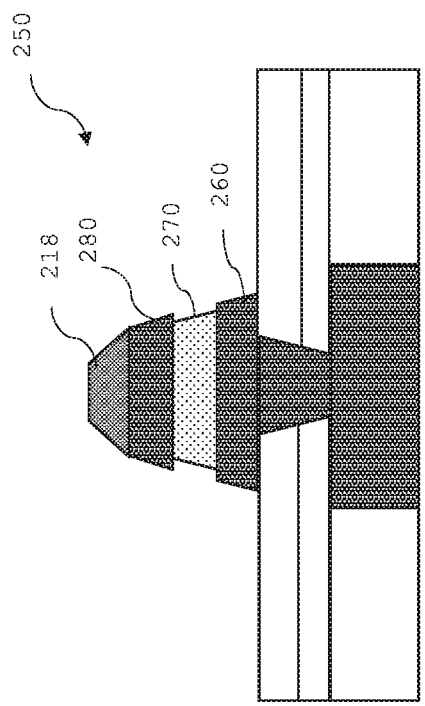

Referring now to FIG. 5F, after the dry etching is stopped, the coating of the protective polymer 220 is removed from the sidewalls of the stack 250 by, for example, a wet clean. The removal of the coating of protective polymer 220 (which is contaminated with material (iridium at least) from the layer of the conductive substrate) leaves sidewalls at the CEM layer 270 which are substantially free from the material of the conductive substrate (iridium at least).

Note that the same wet clean or a separate wet clean can be used to remove correlated electron material at the sidewalls of the CEM layer 270. This wet clean may remove the correlated electron material which has become damaged during dry etching of the CEM layer 204. It may, in particular, remove correlated electron material to an inward extend of 1 to 10 nm at each sidewall of the CEM layer 270 and so leave a clean and undamaged sidewall.

The process of integration of the device to an integrated circuit may be continued with the deposition of a cover layer comprising an insulating material, for example, silica, and etching of a trench in the cover layer which exposes the conductive overlay of the device.

A metal interconnect is deposited in the trench by, for example, electroplating, so that it contacts the conductive overlay of the device and fills the trench.

Note that the cover layer of insulating material may be deposited over the hard mask 218 and the hard mask 218 removed from the stack during the etching of the trench in the cover layer.

Note further that the integrated device is characterised by a CEM layer 270 which is slightly indented from the conductive overlay 280 and the conductive substrate 260 of the device.

Figure 6:
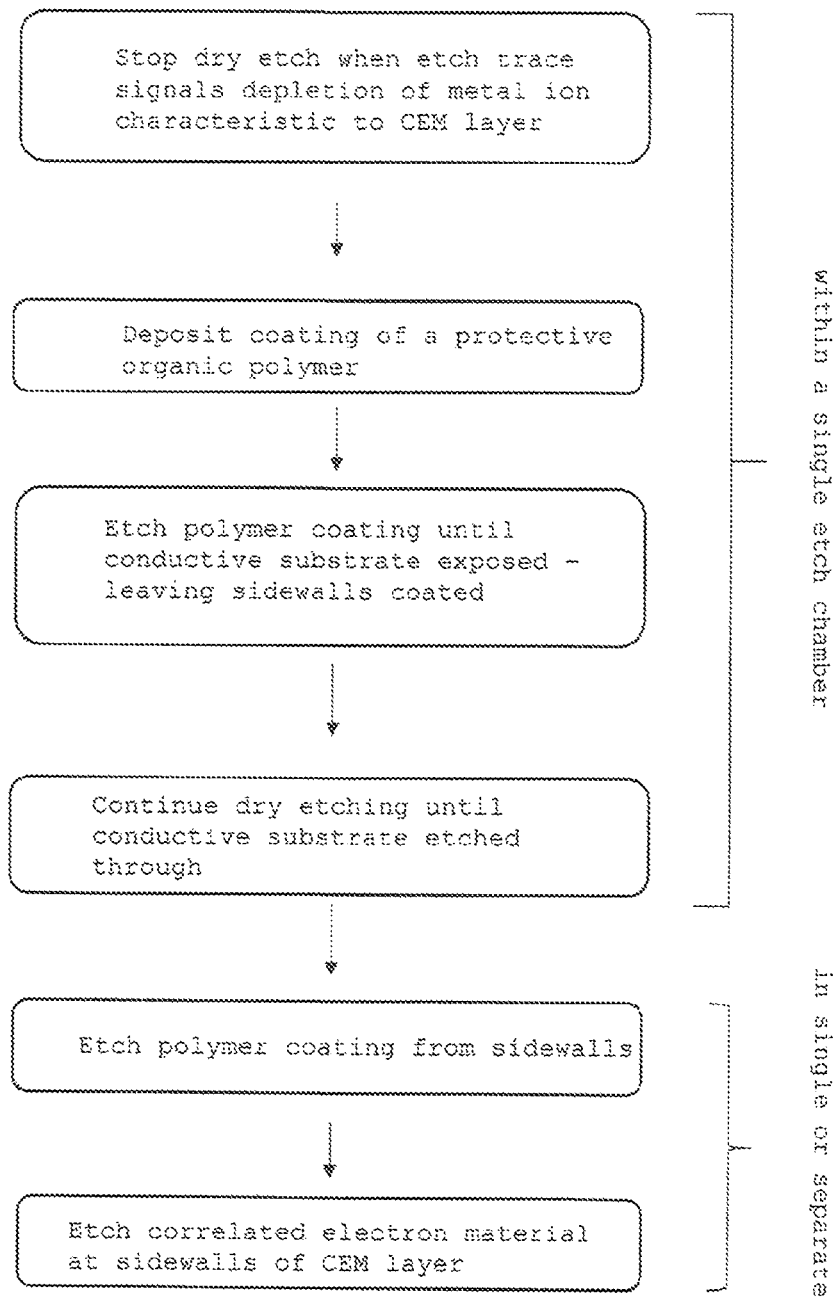
FIG. 6 is a flow diagram illustrating an embodiment of FIGS. 5A, 5B, 5C, 5D, 5E and 5F.

FIG. 6 is a flow diagram particularly highlighting the steps involved in the integration a CEM device according to one embodiment of the present disclosure.

As may be seen, the dry etching of the (layer of conductive overlay 206 and) the correlated electron material 204 is stopped when the etch trace signals a depletion in the amount of metal ion characteristic to the CEM layer 270 (nickel, for example). The depletion in the amount of nickel ion indicates that the layer of conductive substrate 202 has been reached. After the dry etching has been stopped, a coating of a protective organic polymer 220 is deposited over the part-formed stack 250' and the dry etching resumed (or another etching process or process condition is used) until the layer of the conductive substrate 202 is again exposed. The dry etching is resumed until the glass plate 208 is reached. After stopping the dry etching, the polymer coating 220 (including metal (iridium) residues) is removed from the stack 250 using a wet clean.

The integration may be continued, for example, by depositing a cover layer comprising an insulating material, for example, silica, etching of a trench in the cover layer to expose the conductive overlay of the device and depositing of a metal interconnect in the trench so that it contacts the conductive overlay of the device and fills the trench.

The integration may also comprise depositing a moisture barrier layer (not shown), for example, of silicon nitride ($Si_3N_4$), over the stack 250 prior to the etching of the trench.

It may further comprise deposition of a metal barrier layer, for example, titanium nitride or tantalum nitride, in the trench and over the conductive overlay prior to deposition of the metal interconnect.

The invention claimed is:

1. A method for the fabrication of a correlated electron material (CEM) device, the method comprising:
    forming a layer of a conductive substrate;
    forming a layer of a CEM on the layer of the conductive substrate;
    forming a layer of a conductive overlay on the layer of the CEM; and
    patterning the layer of the conductive substrate, the layer of the CEM and the layer of the conductive overlay to form a stack comprising the layer of the conductive substrate, the layer of the CEM and the layer of the conductive overlay, wherein the patterning comprises:
    forming a hard mask on the layer of the conductive overlay;
    dry etching the layer of the conductive overlay and the layer of the CEM to form a partially formed stack, the dry etching of the layer of the CEM to impart damage providing a conductive path between the layer of the conductive overlay and the layer of the conductive substrate at sidewalls of the layer of the CEM;
    depositing a coating of a protective polymer over at least sidewalls of the partially formed stack;
    dry etching the layer of the conductive substrate;
    removing at least a portion of the coating of the protective polymer from the sidewalls of the partially formed stack to expose at least a portion of the sidewalls of the layer of the CEM; and
    treating the exposed sidewall portion of the layer of the CEM to remove a portion of the damage to the layer of the CEM at the sidewalls of the layer of the CEM.

2. The method according to claim 1, comprising: depositing the coating of the protective polymer over a whole of the partially formed stack.

3. The method according to claim 1, comprising: depositing a fluorocarbon or a hydrofluorocarbon as the coating of the protective polymer.

4. The method according to claim 1, wherein removing at least a portion of the coating of the protective polymer from the sidewalls further comprises removing at least a portion of the coating of the protective polymer from at least a portion of an upper surface of the layer of the conductive substrate and at least a portion of an upper surface of the hard mask.

5. The method according to claim 1, wherein treating the exposed sidewall portion of the CEM comprises etching CEM from the sidewalls of the layer of the CEM in the stack to eliminate the portion of the damage at the sidewalls of the layer of the CEM.

6. The method according to claim 5, wherein the etching of the CEM from the sidewalls of the layer of the CEM in the stack indents the layer of the CEM by 1 nm to 10 nm.

7. The method according to claim 1, wherein the removing of the at least the portion of the coating of the protective polymer and the treating of the exposed sidewall portion of the layer of the CEM are carried out as a single step.

8. The method according to claim 1, wherein the layer of the CEM comprises nickel oxide and the completion of the dry etching of the layer of the conductive overlay and the layer of the CEM is determined by monitoring depletion of nickel ion based, at least in part, on attenuation of a nickel-based signal.

9. The method according to claim 1, wherein depositing the coating of the protective polymer and dry etching of the layer of the conductive substrate are carried out in a single etch chamber.

10. The method according to claim 1, wherein the layer of the conductive substrate is formed on an insulating substrate including a via contacting the layer of the conductive substrate and a metal interconnect.

11. The method according to claim 1, further comprising: depositing a cover layer over the stack and patterning the cover layer to form a trench in the cover layer and expose at least a part of the layer of the conductive overlay.

12. The method according to claim 11, further comprising: depositing a moisture barrier layer over the stack prior to the deposition of the cover layer.

13. The method according to claim 11, further comprising: depositing a metal barrier layer over the exposed conductive overlay and at least the interior walls of the trench.

14. The method according to claim 13, further comprising: depositing a metal interconnect over the layer of the conductive overlay and the metal barrier layer to substantially fill the trench.

15. The method according to claim 1, wherein the layer of the CEM comprises a doped metal compound of a d- or f-block element.

16. A correlated electron material (CEM) device, comprising: a conductive substrate, a CEM layer and a conductive overlay, wherein the CEM layer to have at least one sidewall having, at least in part, a recess as compared to a sidewall of the conductive substrate and a sidewall of the conductive overlay.

17. An integrated circuit comprising: a correlated electron material (CEM) device comprising a conductive substrate, a CEM layer and a conductive overlay, wherein the CEM device to be provided between an upper metal interconnect in a cover layer and a lower metal interconnect in a substrate, the upper metal interconnect and the conductive overlay to have a trench contact, and wherein the CEM layer to have at least one sidewall having, at least in part, a recess therein as compared to a sidewall of the conductive substrate and a sidewall of the conductive overlay.

18. An electronic device comprising: an integrated circuit to have a correlated electron material (CEM) device comprising a conductive substrate, a CEM layer and a conductive overlay, wherein the CEM device to be provided between an upper metal interconnect in a cover layer and a lower metal interconnect in a substrate, the upper metal interconnect and the conductive overlay to have a trench contact, and wherein the CEM layer to have at least one sidewall having, at least in part, a recess as compared to a sidewall of the conductive substrate and a sidewall of the conductive overlay.

\* \* \* \* \*